United States Patent
Moschopoulos et al.

(10) Patent No.: US 6,809,964 B2
(45) Date of Patent: Oct. 26, 2004

(54) NONVOLATILE SEMICONDUCTOR MEMORY DEVICE CAPABLE OF TRANSFERRING DATA INTERNALLY WITHOUT USING AN EXTERNAL BUS

(75) Inventors: Anthony Moschopoulos, San Jose, CA (US); Vinod Lakhani, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 281 days.

(21) Appl. No.: 09/941,647

(22) Filed: Aug. 30, 2001

(65) Prior Publication Data

US 2003/0043627 A1 Mar. 6, 2003

(51) Int. Cl.$^7$ .............................................. G11C 16/04
(52) U.S. Cl. .............................. 365/185.11; 365/185.29; 365/185.33
(58) Field of Search ....................... 365/185.11, 185.29, 365/185.33, 185.12

(56) References Cited

U.S. PATENT DOCUMENTS 6,040,997 A * 3/2000 Estakhri ................. 365/185.33
6,343,035 B1 * 1/2002 Kubo et al. ............. 365/189.05

* cited by examiner

*Primary Examiner*—Andrew Q. Tran
(74) *Attorney, Agent, or Firm*—Dickstein Shapiro Morin & Oshinsky LLP

(57) ABSTRACT

A flash memory receives an internal data transfer command from a memory controller which causes the flash memory to copy data from one sector of the flash memory to another sector of the flash memory without presenting any data traffic to the bus. The internal data transfer command may optionally include a count field which causes the flash memory to transfer a plurality of adjacent sectors starting from a source address to a corresponding plurality of adjacent sectors starting at a destination address. The internal data transfer command is particularly useful for backing up the contents of a block prior to an erase operation. The internal data transfer command may also be used, if necessary, to restore the data subsequent to the erase operation.

43 Claims, 14 Drawing Sheets

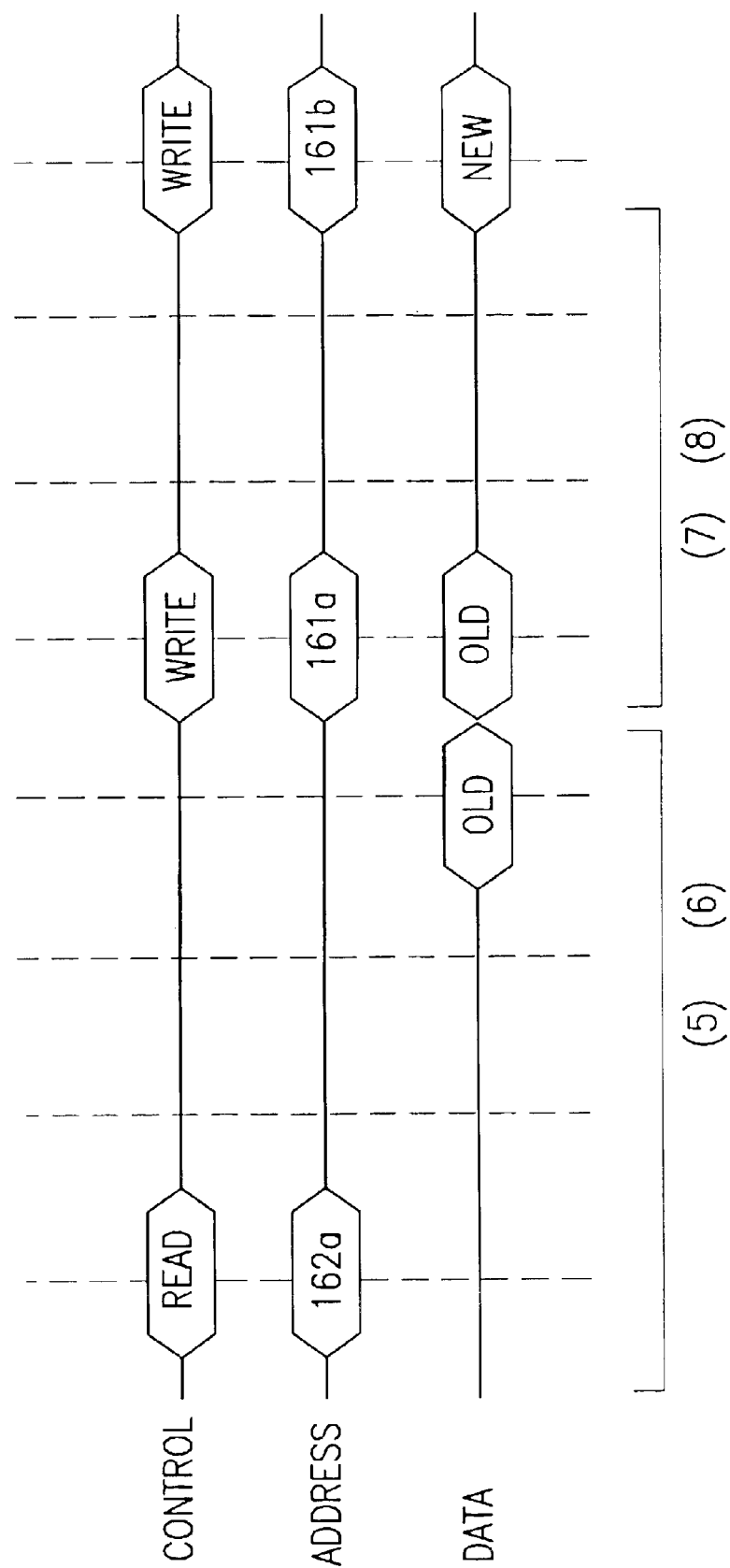

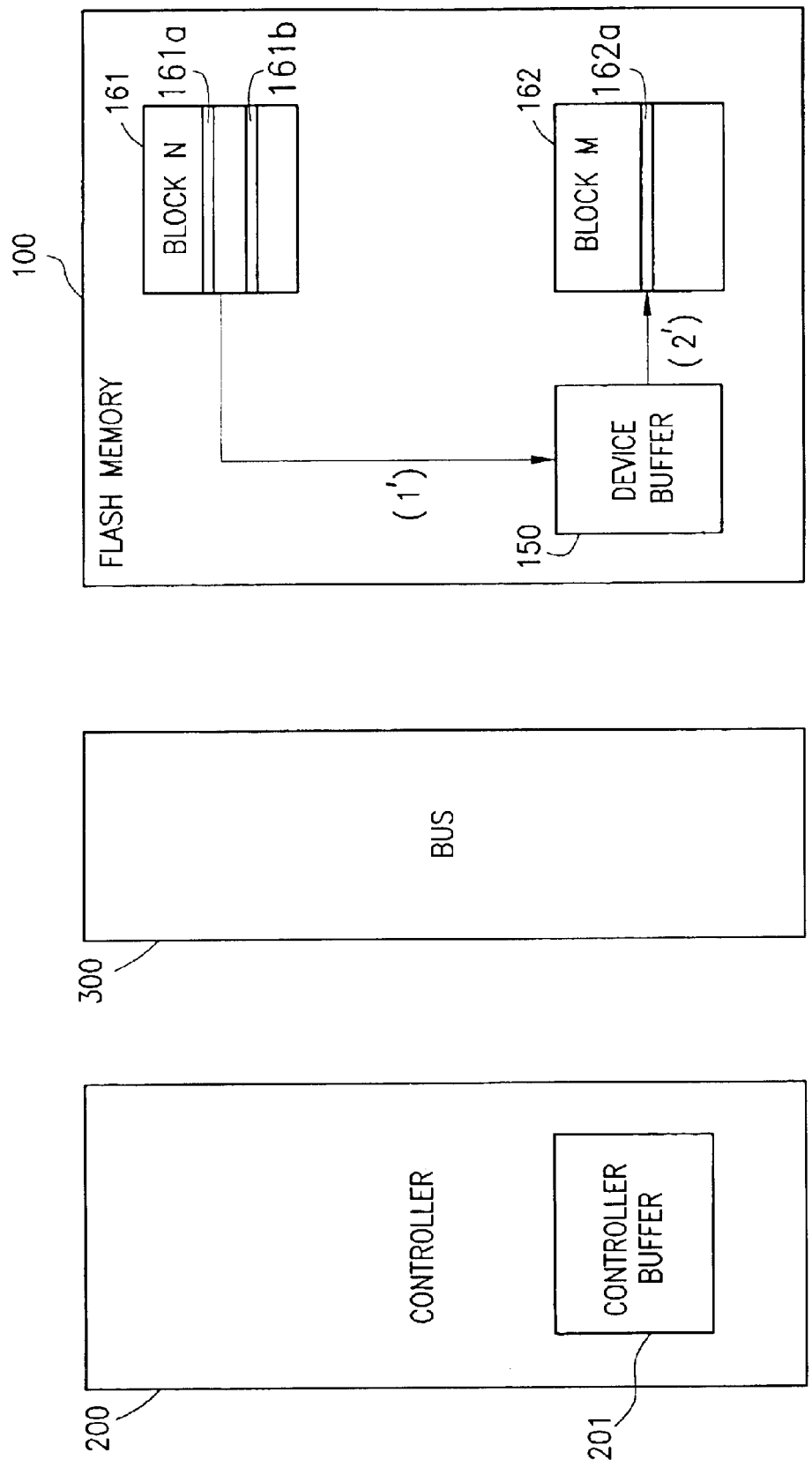

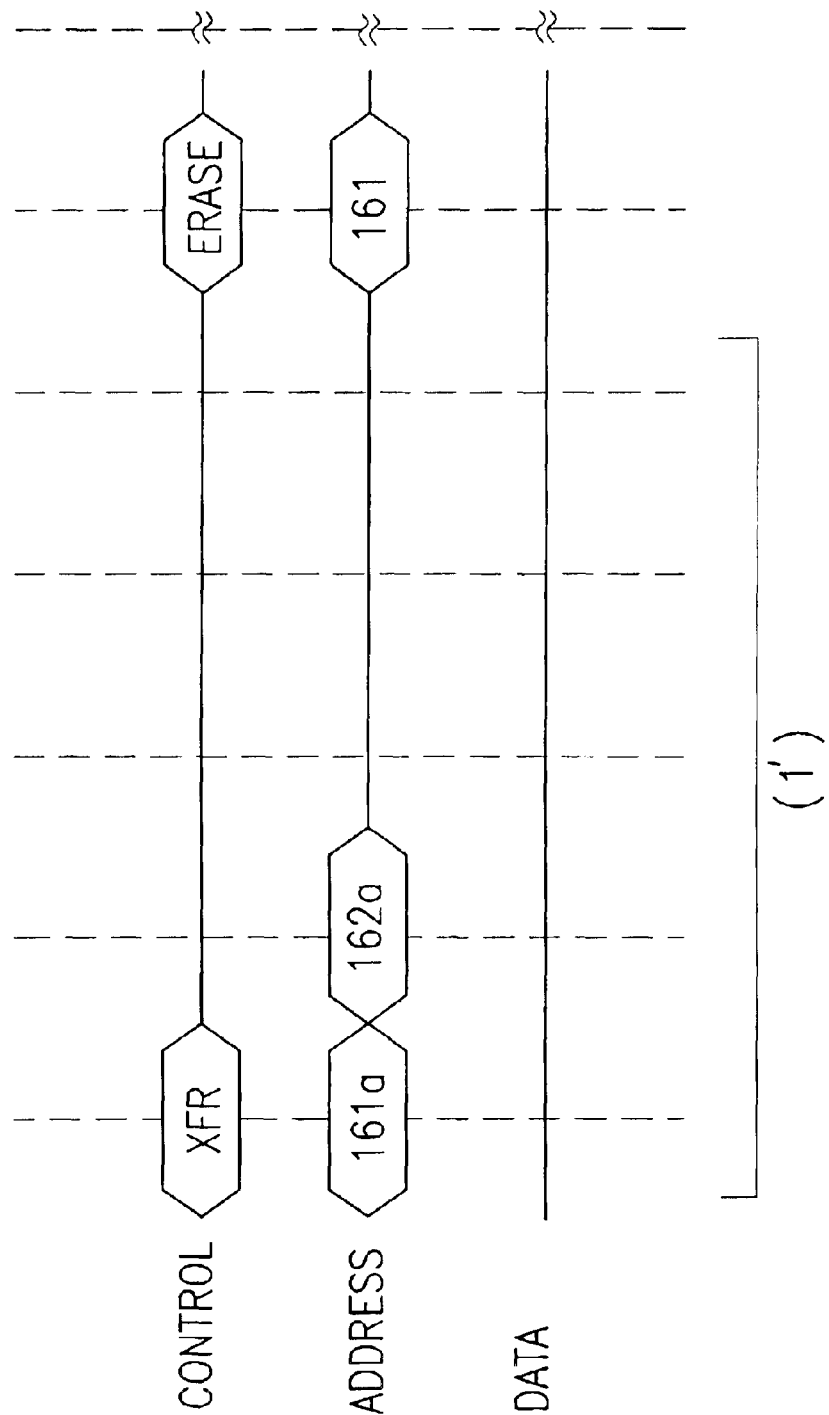

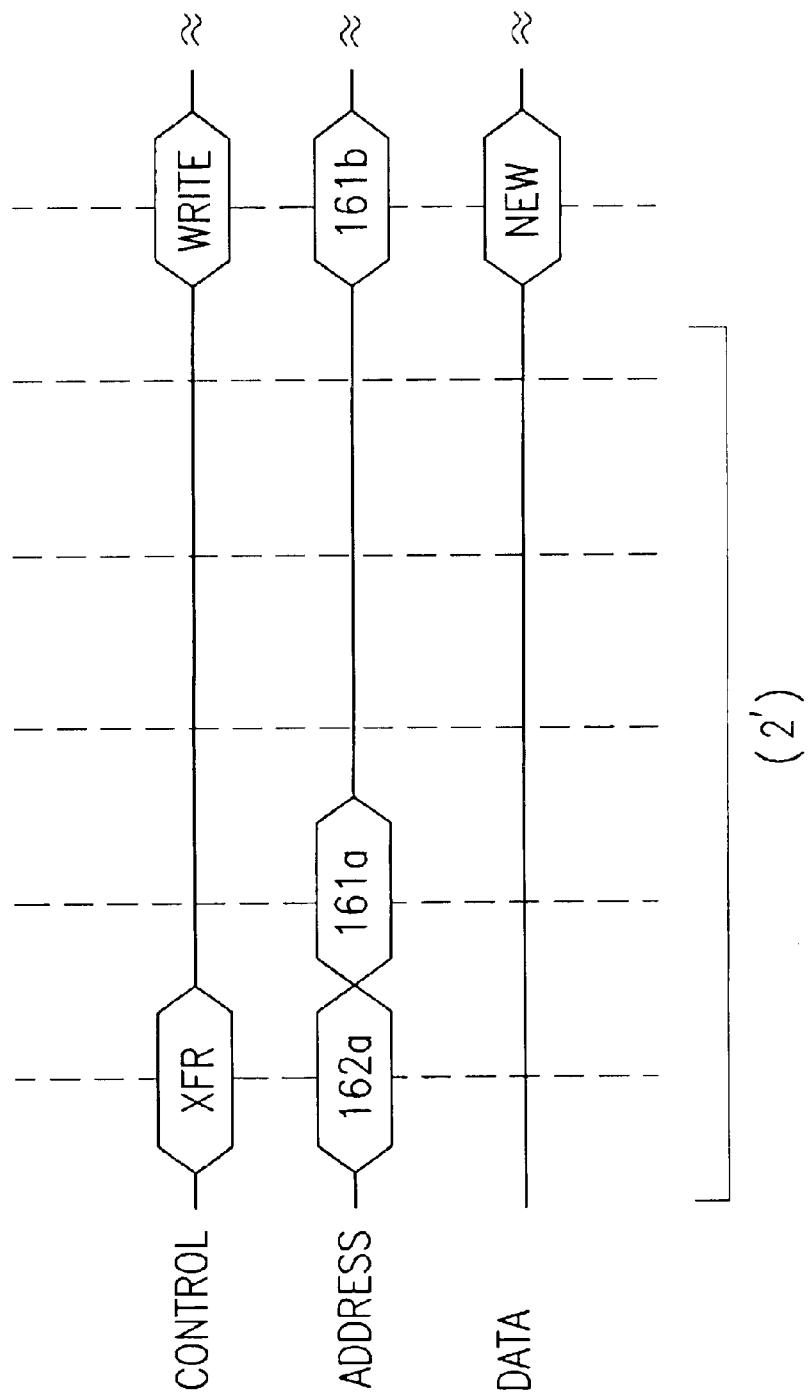

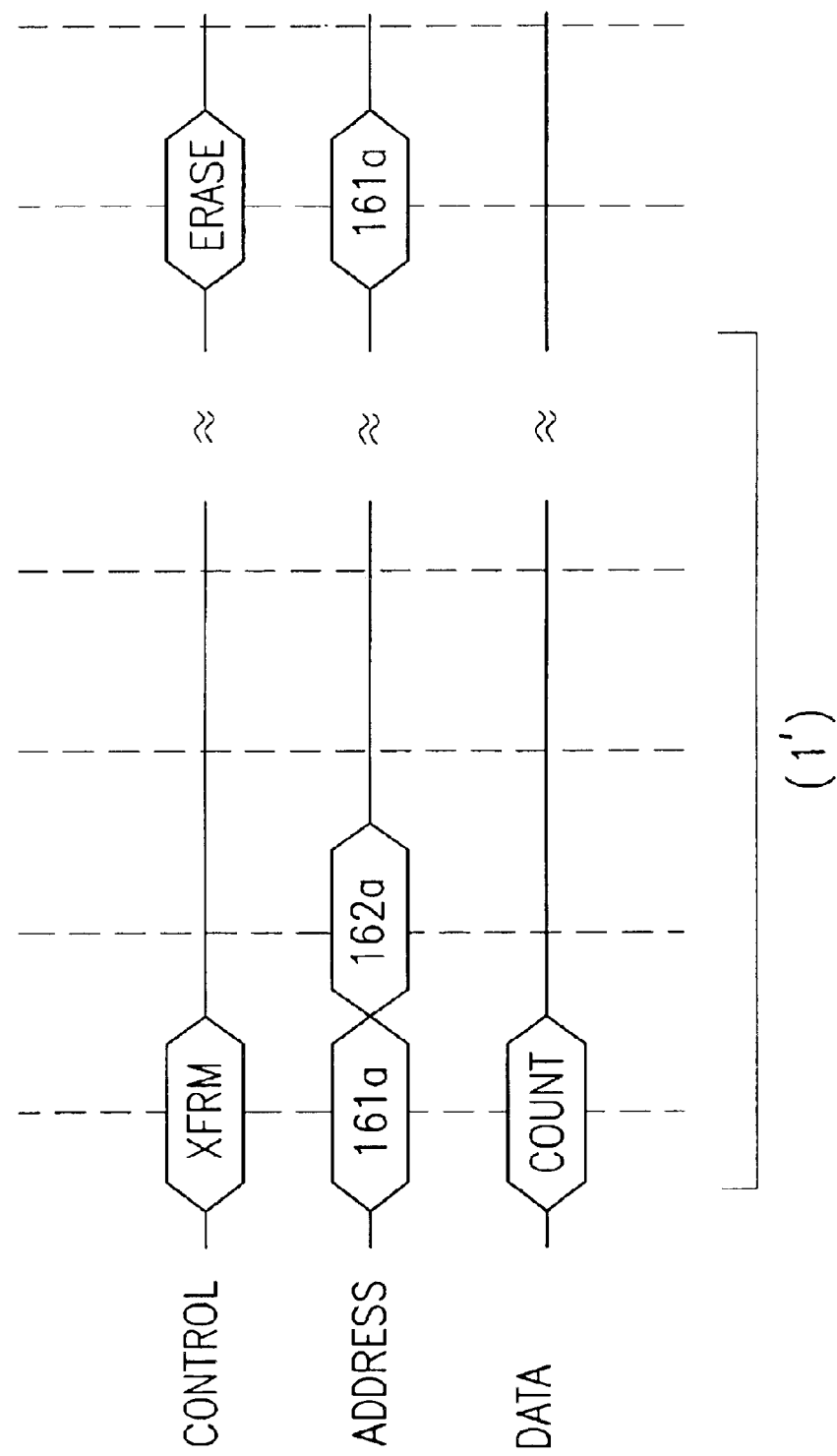

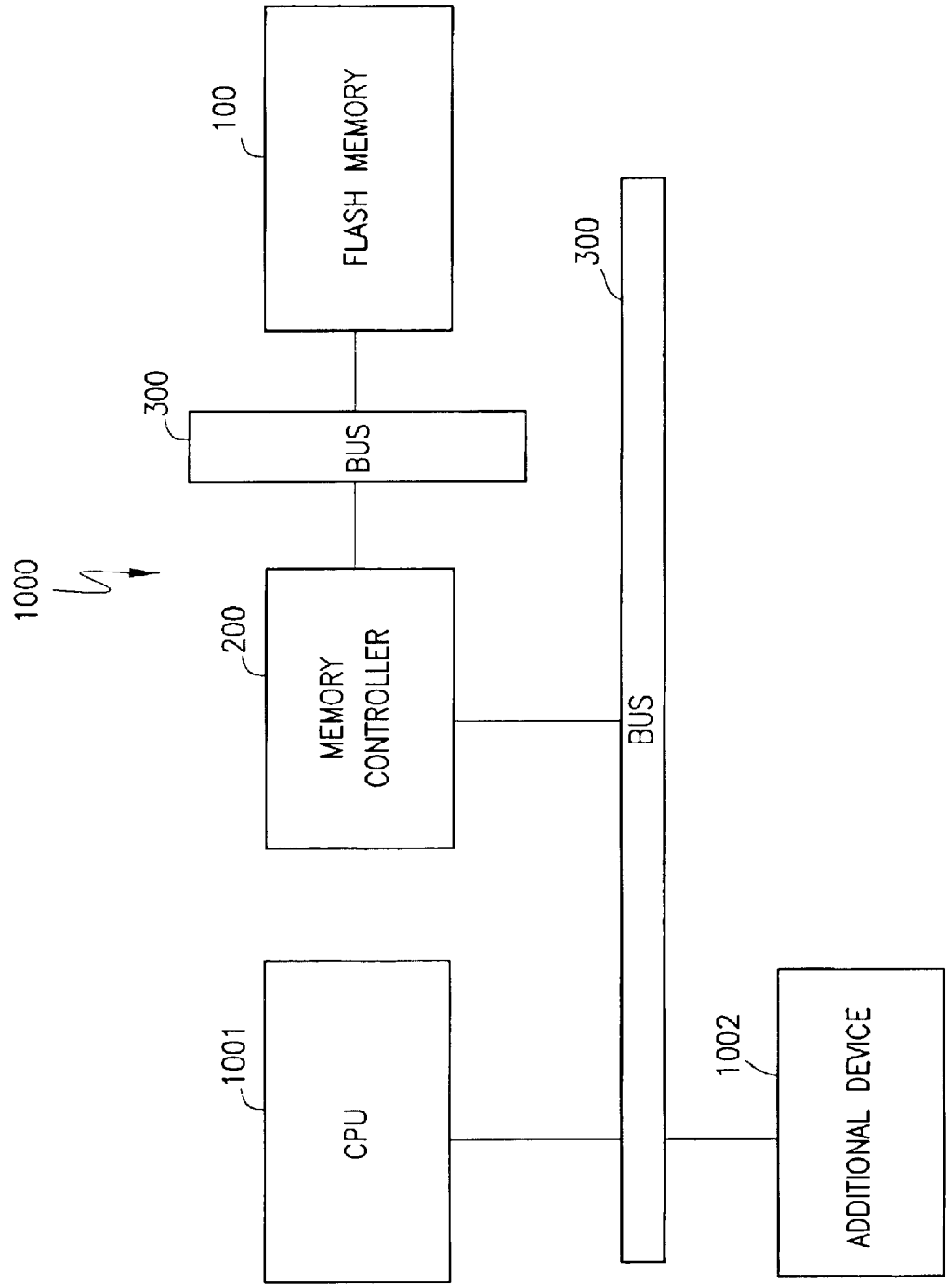

NONVOLATILE SEMICONDUCTOR MEMORY DEVICE CAPABLE OF TRANSFERRING DATA INTERNALLY WITHOUT USING AN EXTERNAL BUS

FIELD OF INVENTION

The present invention relates to flash memory systems, and more particularly to internally transferring data from one portion of a flash memory device to another portion of the flash memory device.

BACKGROUND OF THE INVENTION

FIG. 1 is a block diagram of a flash memory device 100. The flash memory 100 includes several signal lines, including a power line 110, a erase power line 111, a plurality of address lines 112, a plurality of data lines 113, and a plurality of control lines 114. The plurality of control lines may comprise well known control signals, such as row and column address strobes, clock signals, write enable signals, and chip select signals, which are not individually shown in order to avoid cluttering the figure. As is well known in the art, the state of the signals on the plurality of control lines 114 may be used to designate commands. These commands include a READ command for reading data, a WRITE command for writing data, and an ERASE command for erasing a block.

Commands are decoded by a command execution logic 120, which in cooperation with a state machine 121, cause the flash memory device 100 to execute the asserted commands. The data within the flash memory device is stored in a memory array 160, which is organized into a plurality of blocks 161–162. Each block 161–162 is typically comprised of a plurality of sectors 161a, 161b, 162a, 162b which store one or more bytes of data. The memory array 160 may be accessed through the addressing and I/O circuit 140, which includes a device buffer 150. The device buffer 150 can vary in size but must have a minimum capacity of at least the data which can be stored in a sector of the flash memory device. Additionally, the erase power may be supplied to the memory array 160 via the erase voltage switch 130. The state of the switch 130 is controlled by the state machine 121.

While FIG. 1 shows only a single memory array 160 with two blocks 161–162, it should be understood that flash memories may include multiple arrays, or banks, each having more than two blocks. For example, one commercially available 64 Mb flash memory device available from the assignee of this invention is organized into four banks each having a 4096 by 256 array of 16-bit sectors. Each bank of this flash memory is divided into four blocks, therefore the flash memory device has sixteen blocks.

Flash memories are non-volatile memories implemented using floating gates. The presence or absence of a charge on the floating gate is used to indicate whether a bit is a binary "0" or a binary "1". Flash memories are further characterized by the fact that each bit may always be changed from a first state to a second state. The only way to change a bit from the second state to the first state is to use the erase operation. However, the erase operation also erases every other bit in the block.

The requirement to erase an entire block when changing a bit from the second state to the first state greatly complicates writing to a flash memory. If data is written to a newly erased or a previously unwritten address, the data may simply be written into the specified address. However, writing data to an address which was previously written requires a four step process. First, each sector (other than the sector to be written with new data) within that block must be backed up. Second, the block is erased. Third, the backed up data is written to the newly erased sector. Finally, the new data is written.

This process is illustrated in FIGS. 2A, 2B, 3A and 3B. FIGS. 2A and 2B are simplified block diagrams of the flash memory device 100 coupled to a controller 200 via a bus 300. The diagrams are simplified by only illustrating certain components of the flash memory device 100 and the controller 200, specifically memory blocks 161, 162, the device buffer 150, and sectors 161a, 161b, 162a of the flash memory device 100 and the buffer 201 of the controller 200. Additionally, FIGS. 2A and 2B include arrows showing data transfers. These data transfers are sequentially labeled with numbers located within parenthesis showing the order of the data transfer. FIGS. 3A and 3B are timing diagrams illustrating the processes shown in FIGS. 2A and 2B and contains the same labels to identify the data transfer events on the timing diagram.

Referring now to FIGS. 2A and 3A, suppose sectors 161a and 161b contain data (i.e., were previously written) and new data is to be written into sector 161b. The process begins when the controller 200 issues a read command to sector 161a. The first data transfer (1) is from sector 161a to the device buffer 150. The second data transfer (2) is from the device buffer 150 to the controller buffer 201. As shown in FIG. 3A, data transfers (1) and (2) begin when the controller 200 asserts a READ command on the control line 114, while asserting the address of sector 161a on the address lines 112, and ends when the flash memory device 100 outputs the "OLD" data contained sector 161a onto the data lines 113 (FIG. 1).

At this point, the controller 200 can write the data in sector 161a to another sector 162a in a different block 162. Thus, the third data transfer (3) is from the controller buffer 201 to the device buffer 150. The fourth data transfer (4) is from the device buffer 150 to sector 162a. As shown in FIG. 3A, data transfers (3) and (4) begin when the controller 200 asserts a WRITE command on control lines 114, the address associated with sector 162a on the address lines 112, and the "OLD" data on data lines 113. The first through fourth data transfers are repeated, as necessary, until each sector in block 161 which contains data is transferred to block 162. The only exception is the sector which is to be written with new data. In this example, only sector 161a required copying to an alternate block. Thus, at this point block 161 can be erased. As shown in FIG. 3A, this occurs when the controller 200 asserts the ERASE command on the control lines 114 and the address of block 161 on the address lines 112. The erase command causes every bit in block 161 to be set to the first state, and can take a significant amount of time to complete.

Once block 161 has been erased, the contents of the block (except for the sector receiving the new data) needs to be restored. This process is illustrated in FIG. 2B and 3B, and begins with the fifth data transfer (5), which copies data from sector 162a to the device buffer 150. The sixth data transfer (6) is from the device buffer 150 to the controller buffer 201. As shown in FIG. 3B, data transfers (5) and (6) begin when the controller asserts the READ command on the control lines 114 and the address of sector 162a on the address lines 112, and ends when the flash memory device 100 outputs the "OLD" data on the data lines 113 (FIG. 1).

Now the controller 200 can write the data back to block 161. Thus, the seventh data transfer (7) is between the controller buffer 201 and the device buffer 150. Finally, the eighth data transfer (8) writes the data from the device buffer 150 to sector 161*a*. As shown in FIG. 3B, data transfers (7) and (8) begin when the controller 200 asserts the WRITE command on control lines 114, the address of sector 161*a* on address lines 112, and the "OLD" data on data lines 113. This process is repeated for each sector which was copied from block 161 to block 162. In this example, only sector 162*a* required copying.

Finally, the new data can be written into sector 161*b*. This is shown in FIG. 3B when the controller 200 asserts the WRITE command on control lines 114, the address of sector 161*b* on address lines 112, and the "NEW" data on data lines 113. Alternatively, the new data can be written prior to restoring the old data.

The above process is problematic for at least two reasons. First, the controller's 200 buffer 201 cannot be used for any other purpose during this operation. Additionally, two off chip data transfers were required. Accordingly, there is a need for a flash memory device which is capable of internally copying data from one block to another block.

SUMMARY OF THE INVENTION

The present invention is directed to a flash memory device which supports a new command for internally reading a sector of data from one address of the flash memory device and writing that data to a different sector of the flash memory. In one embodiment, the command includes an option to transfer a plurality of sectors. Since the source and destination addresses are supplied as part of the command, there is no need to transfer the data off chip. Consequently, there is no need for an external flash controller to oversee the data transfer. The present invention allows use of a less complex external flash controller and it also reduces bus traffic, thereby improving system performance. Additionally, by reducing the need to drive data over the bus, a significant reduction in power consumption may be achieved, in both the memory controller and the memory device.

BRIEF DESCRIPTION OF THE DRAWINGS

The foregoing and other advantages and features of the invention will become more apparent from the detailed description of the preferred embodiments of the invention given below with reference to the accompanying drawings in which:

FIGS. 3A and 3B are timing diagrams illustrating the timing of signals when data is copied between different blocks of a flash memory device in accordance to the steps shown in FIGS. 2A and 2B;

FIGS. 4A and 4B are simplified block diagrams of how the flash memory device of the invention transfers data between different blocks;

FIGS. 5A and 5B are timing diagrams illustrating the timing of signals when data is copied between different blocks of a flash memory device in accordance to the steps shown in FIGS. 4A and 4B;

FIGS. 6A and 6B are timing diagrams illustrating the timing of signals when data is copied between different block of a flash memory in accordance to an alternate embodiment of the present invention;

FIG. 7 is a block diagram of a computer system incorporating the flash memory device of the present invention.

DETAILED DESCRIPTION

Figure 2A:
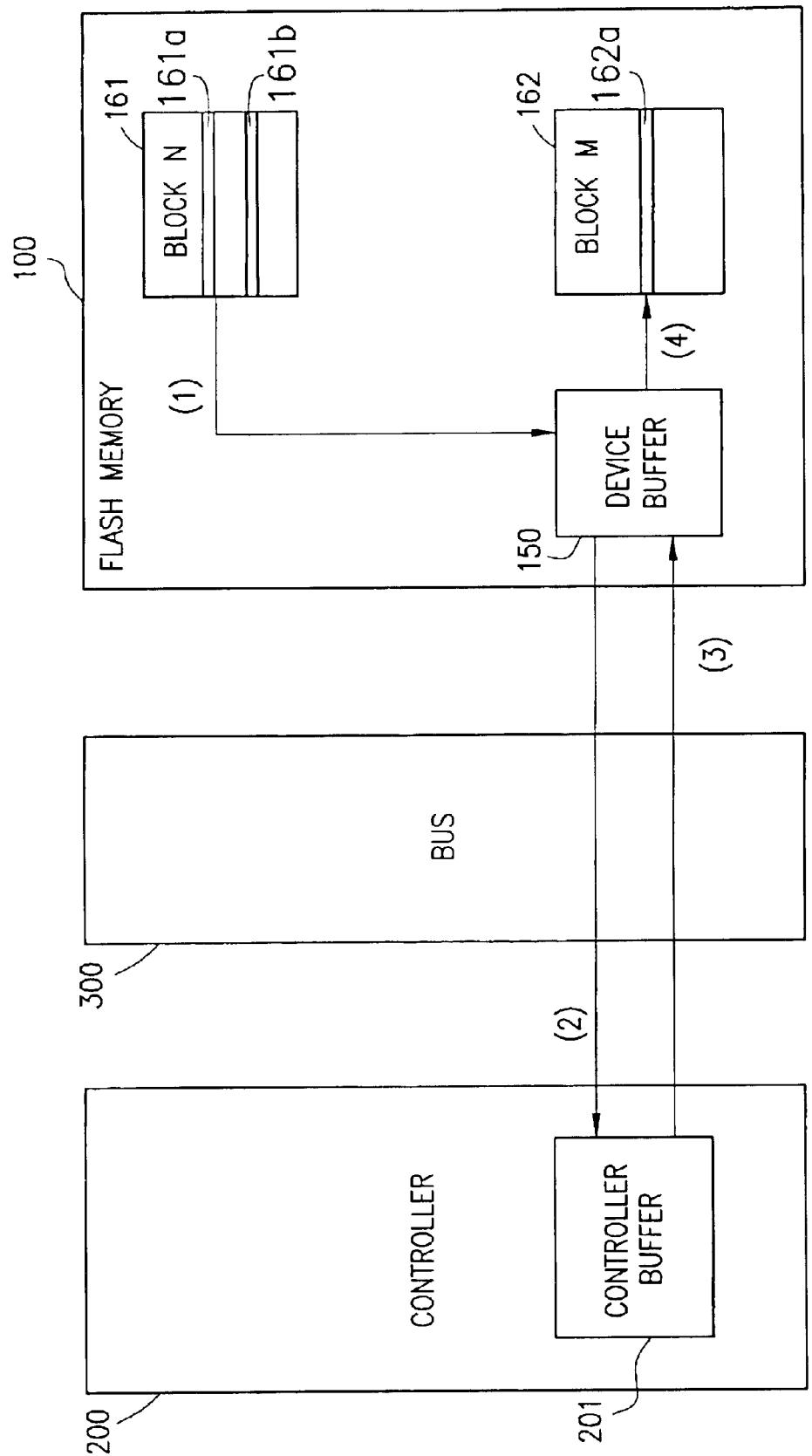
FIGS. 2A and 2B are simplified block diagrams illustrating how data can be copied between different blocks of a flash memory device using an external controller.
Figure 2B:
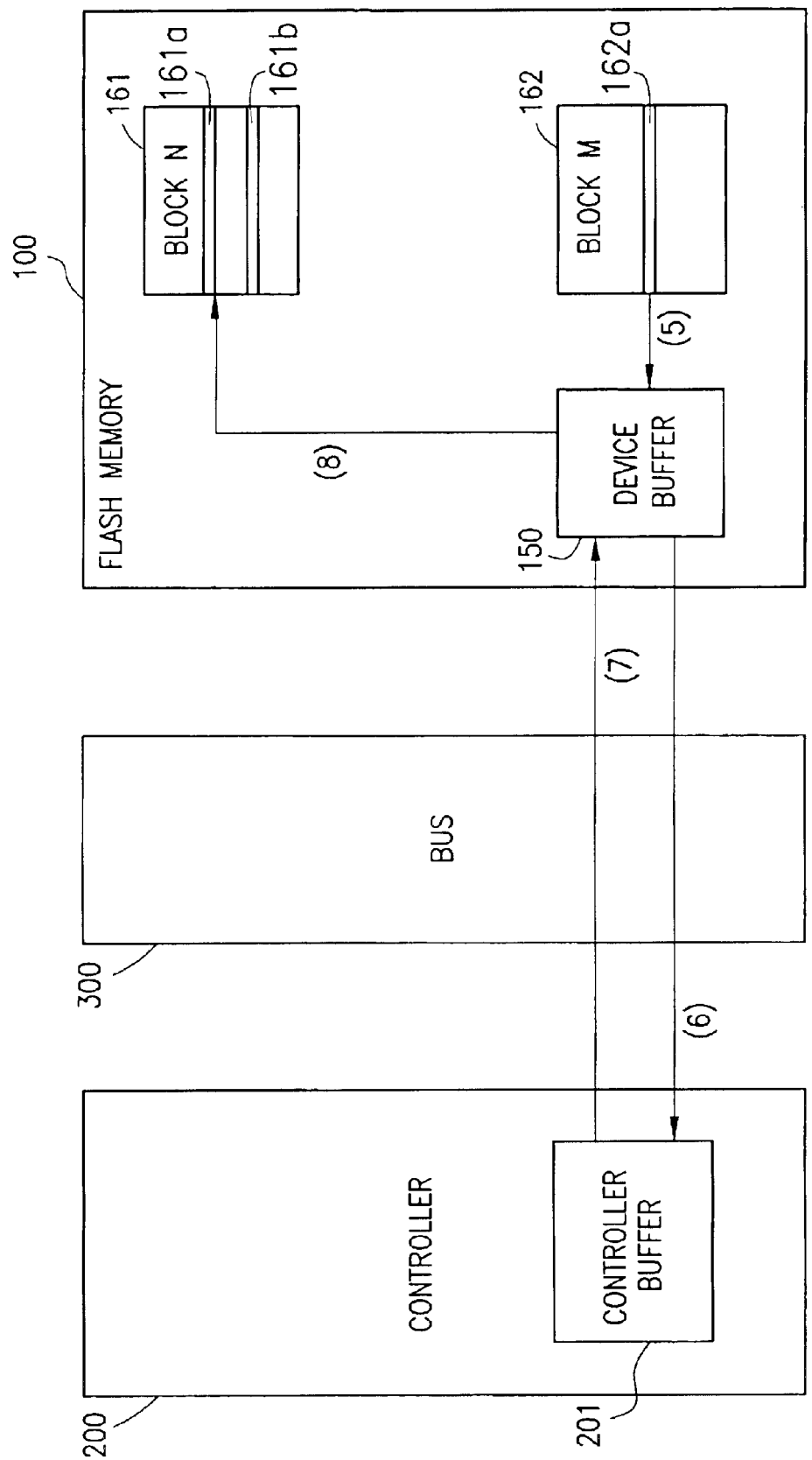
Figure 3A:
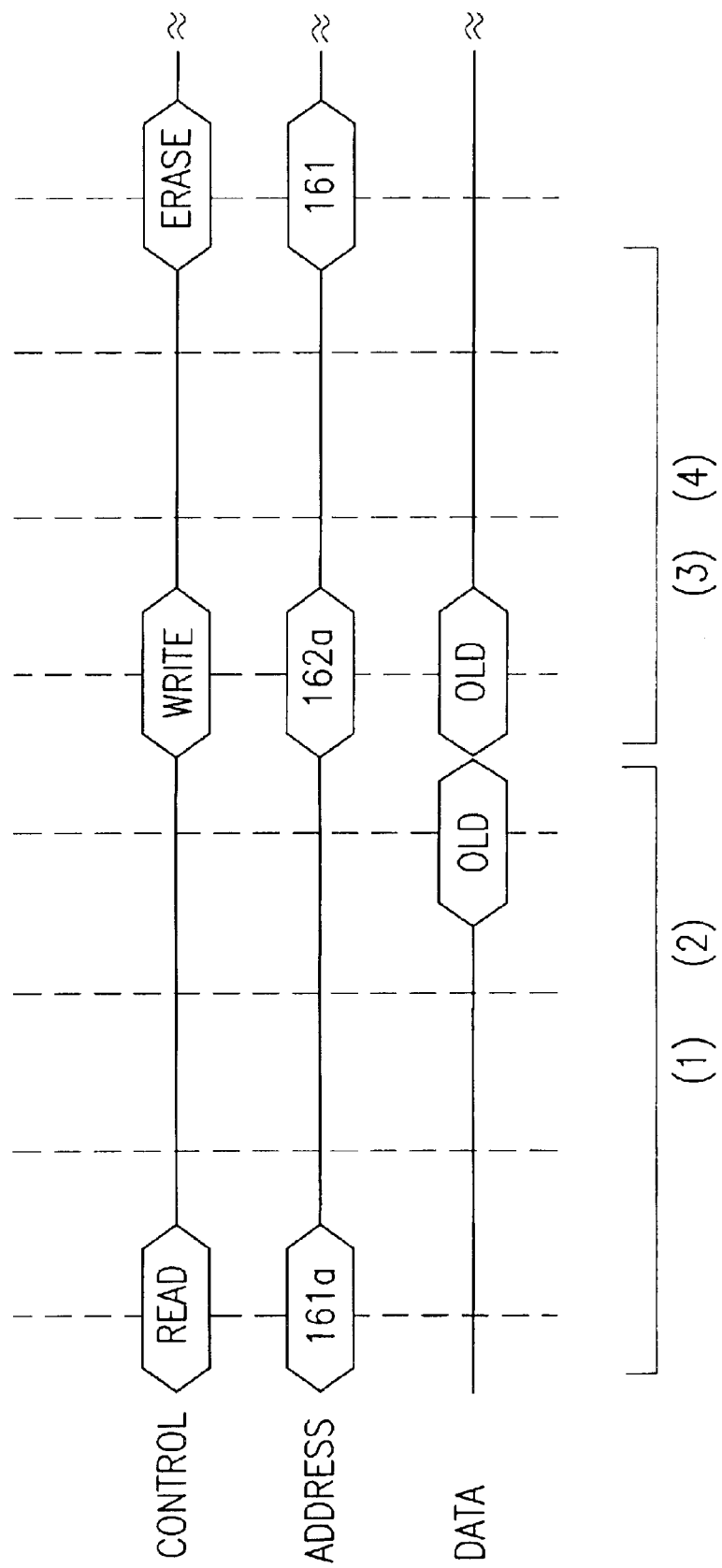
Figure 4B:
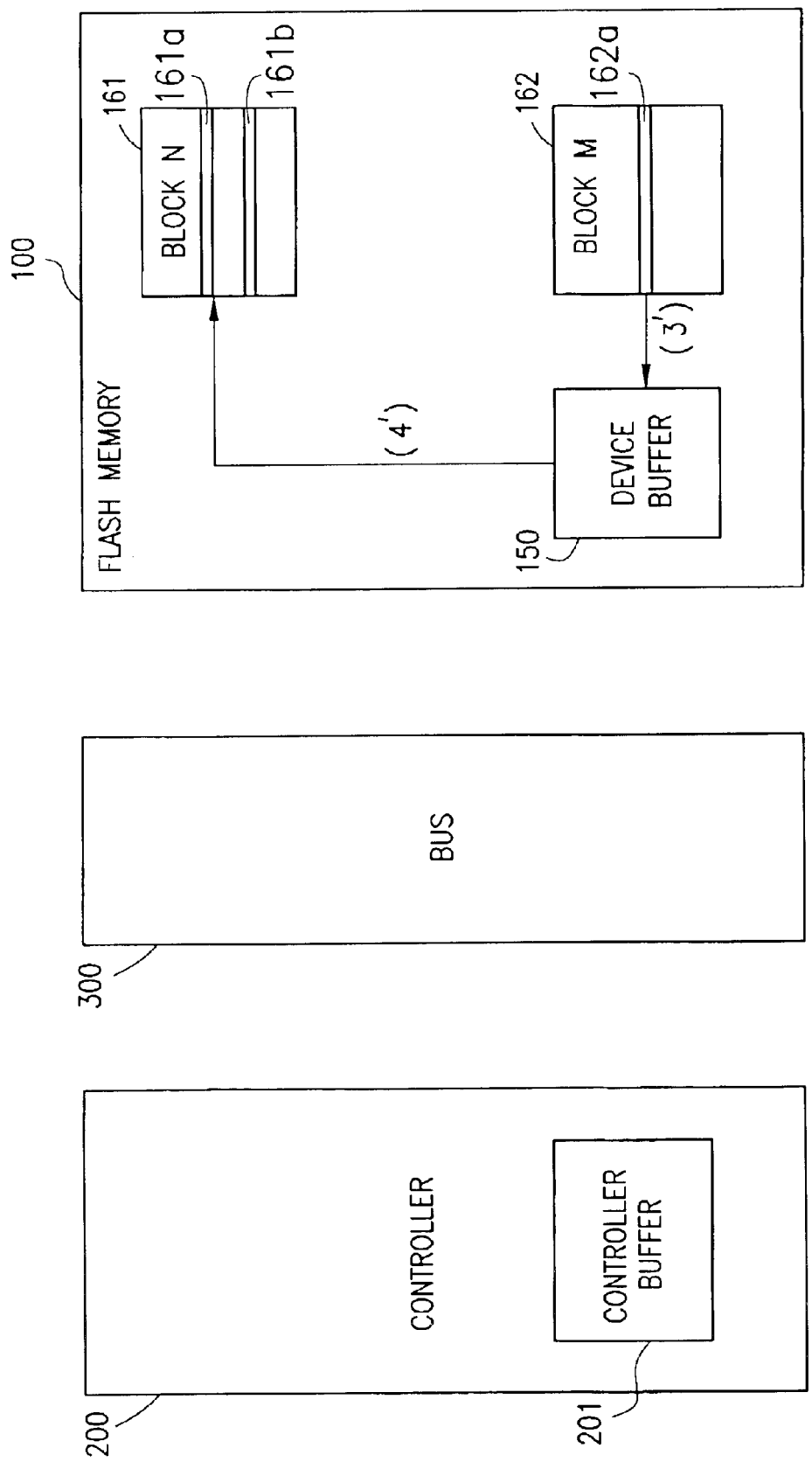

Now referring to the drawings, where like reference numerals designate like elements, there is shown in FIGS. 4A and 4B a simplified block diagram of a flash memory device 100 implementing the present invention. As with FIGS. 2A and 2B, the block diagram has been simplified by only showing the following portions of the flash memory device 100: blocks 161, 162, sectors 161*a*, 161*b*, 162*a*, and device buffer 150. FIGS. 5A and 5B are timing diagrams which further explain the invention. Again, assume that new data is to be written to sector 161*b*, and that sectors 161*a* and 161*b* have been previously written.

As before, it is necessary to back up the contents of any sectors having data from the block containing the sector to be written to a different block. Thus, in the example shown in FIG. 4A, Block 161, sector 161*a* must be backed up to sector 162*a* in block 162. The present invention operates through the use of a new internal data transfer command. This command, which is identified as "XFR" on the FIGS. 5A and 5B, may be implemented by adding its below described functionality into the command execution logic 120 and the state machine 121 of the flash memory device 100. The data transfer command causes two data transfers. In data transfer (1'), the content of sector 161*a* are transferred to the device buffer 150. In data transfer (2'), the content of the device buffer 150 are transferred to sector 162*a*. As illustrated in FIG. 5A, the XFR data transfer command requires the controller 200 to assert the XFR command on control lines 114 and the source address of the data to be transferred on the address lines 112 on a first clock cycle, followed by the destination address of where the data is to be copied on a subsequent clock cycle.

The above procedure is then repeated for each sector in the block containing the sector to be written until each sector containing data has been copied to block 162. The only exception is the sector which is to be written with new data. In the illustrated example, there are no additional blocks to be copied. Consequently, block 161 may now be erased with the ERASE command. This is shown in FIG. 5A, when the controller 200 asserts the ERASE command on control lines 114 and the address of block 161 on the address lines 112.

Now referring to FIG. 4B, the data which had been copied to block 162 needs to be copied back to the newly erased block 161. As shown in FIG. 5B, this can be done using the new data transfer command XFR. This time the source address is sector 162*a* while the destination address is 161*a*. This causes the flash memory device to perform data transfer (3'), which copies data from sector 162*a* to the device buffer 150, and data transfer (4') which copies data from the device buffer 150 to sector 161*a*. The above data transfers (i.e., data transfers 3' and 4') are then repeated for each additional sector which was copied from block 161. In this example, there are no additional sectors. Therefore, the new data can finally be written into sector 161*b*. As shown in FIG. 5B, the controller 200 asserts the WRITE command on control lines 114, the address of sector 161*b* on the address lines 112, and the new data on data lines 113.

Figure 1:
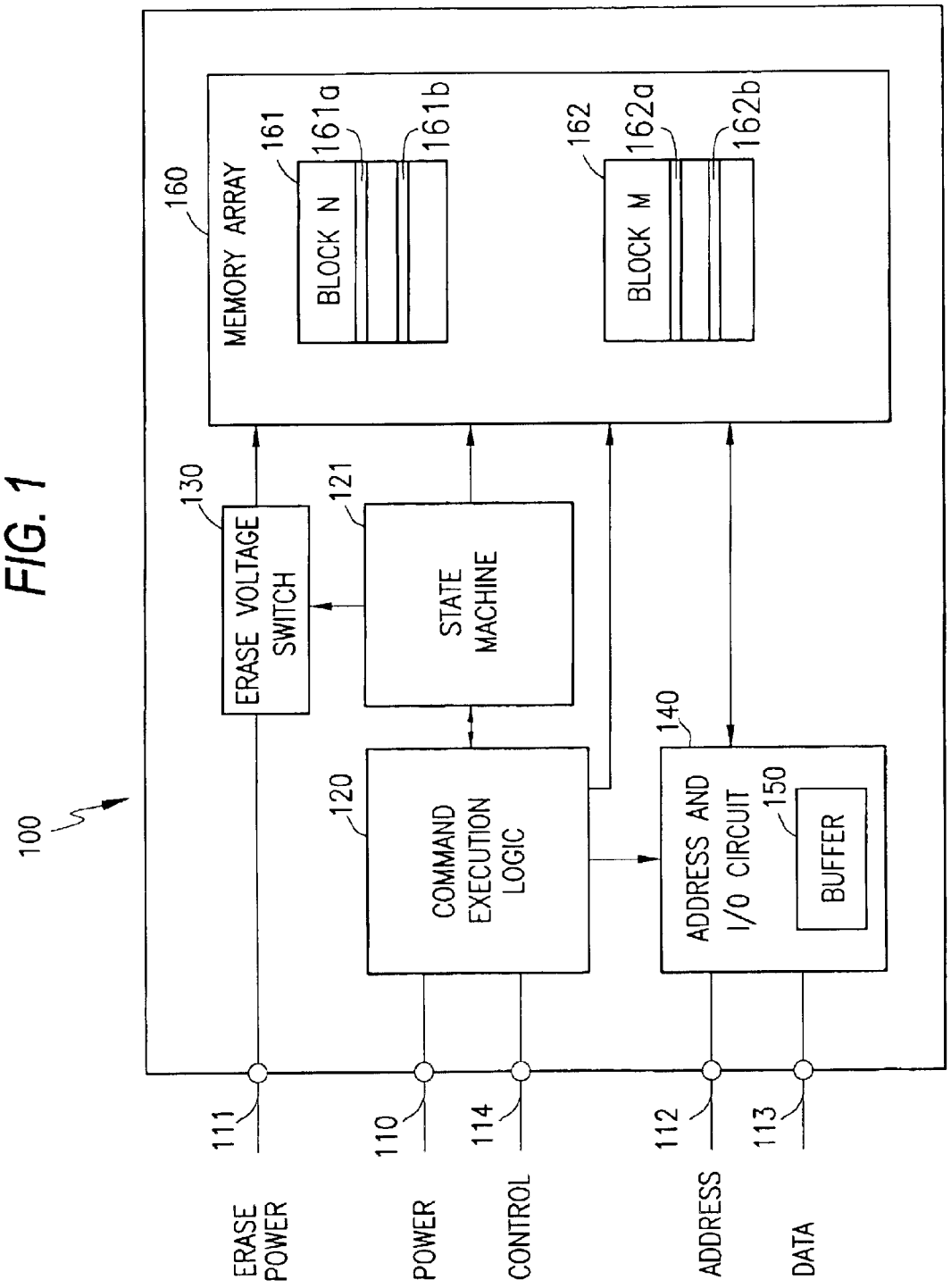
FIG. 1 is a block diagram of a flash memory device.
Figure 6B:
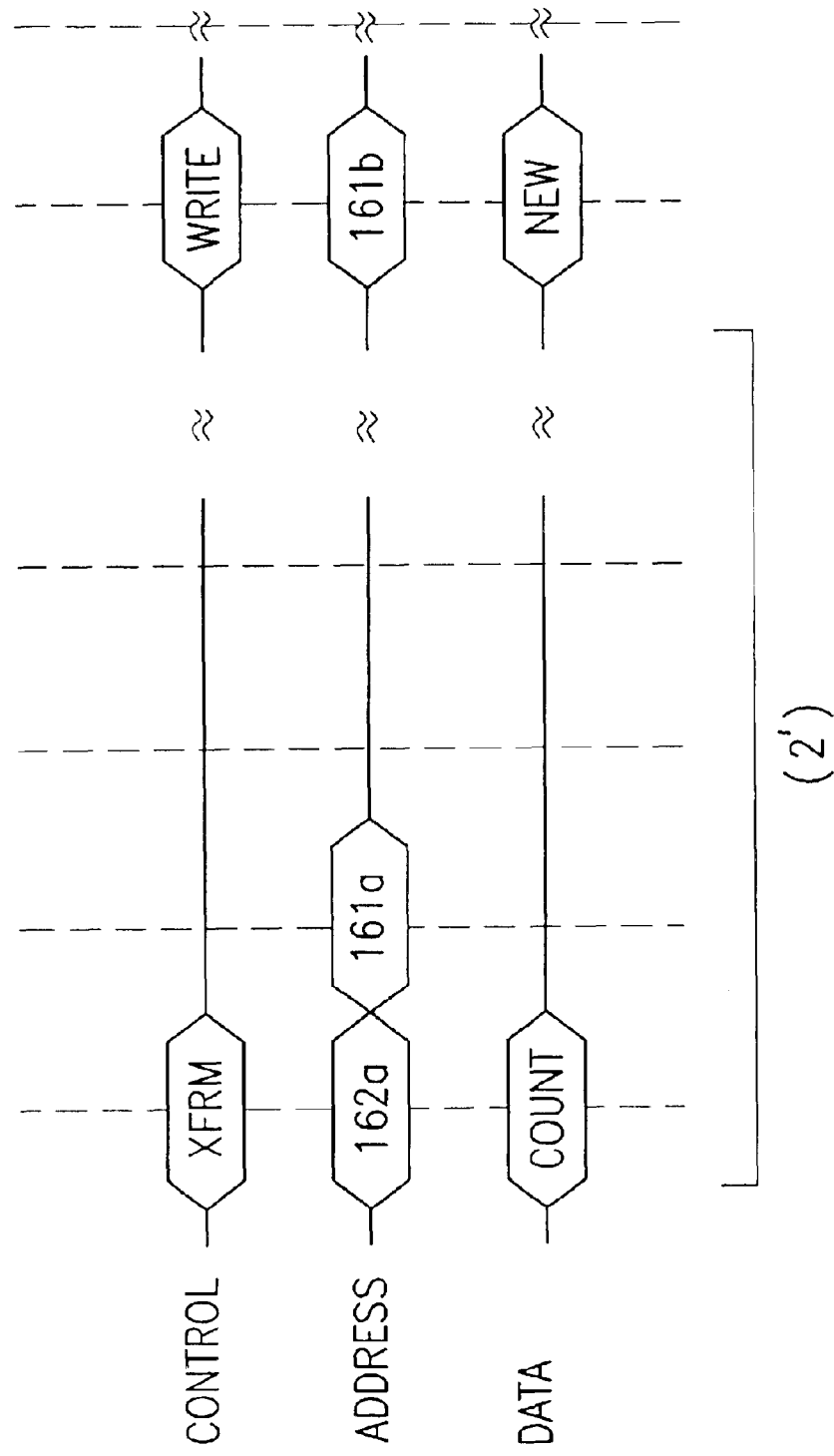

In the above example, only one sector of the block which is to be erased was copied. However, in many instances, a plurality of sectors, especially a plurality of adjacent sectors must be backed up and restored. FIGS. 6A and 6B is an illustration of an alternate embodiment of the internal data transfer command. As shown in FIGS. 6A and 6B, the alternate embodiment implements a multiple data transfer command XFRM. This command is similar to the XFR command of the first embodiment, but it also accepts a COUNT value asserted by the memory controller 200 on the data lines 113. The COUNT value indicates the number of additional adjacent sectors to be copied in addition to the block specified by the source address. The additional adjacent sectors are copied to sectors adjacent to the sector specified by the destination address. Alternatively, instead of a COUNT value, a LENGTH value may be asserted on the data bus, indicating how many adjacent sectors starting at the source address should be transferred to corresponding sectors starting at the destination address. Thus, if sectors 161a and 161b were adjacent sectors, and sectors 162a and 162b (illustrated in FIG. 1) were also adjacent sectors, a single XRFM command issued with a COUNT value of 1 can be used to copy the contents of sector 161a to sector 162a and the contents of sector 161b to sector 162b. Or, if the XRFM command is implemented using a LENGTH parameter instead of a command parameter, the LENGTH parameter would be set to 2 for the above example. The first and second embodiments are independent and the flash memory device 100 can support both the embodiments.

Thus, the present invention implements a new internal data transfer command which accepts a source and a destination address and copies a sector of data from the source address to the sector designated by the destination address. When the source and destination addresses belong to different blocks, the internal data transfer command can be used to back up and restore data before a block is erased. This illustrated in the flow chart of FIG. 8, which illustrates how two internal data transfer command can be used with an erase command to back up a sector of data in a block, erase the entire block containing the sector, and then restore the sector after the block has been erased. These steps are illustrated in FIG. 8, at steps 8000–8008. Once data has been restored to the erased block, new data may be written to the erased block. This is illustrated in FIG. 8 at steps 8009–8012.

Figure 8A:
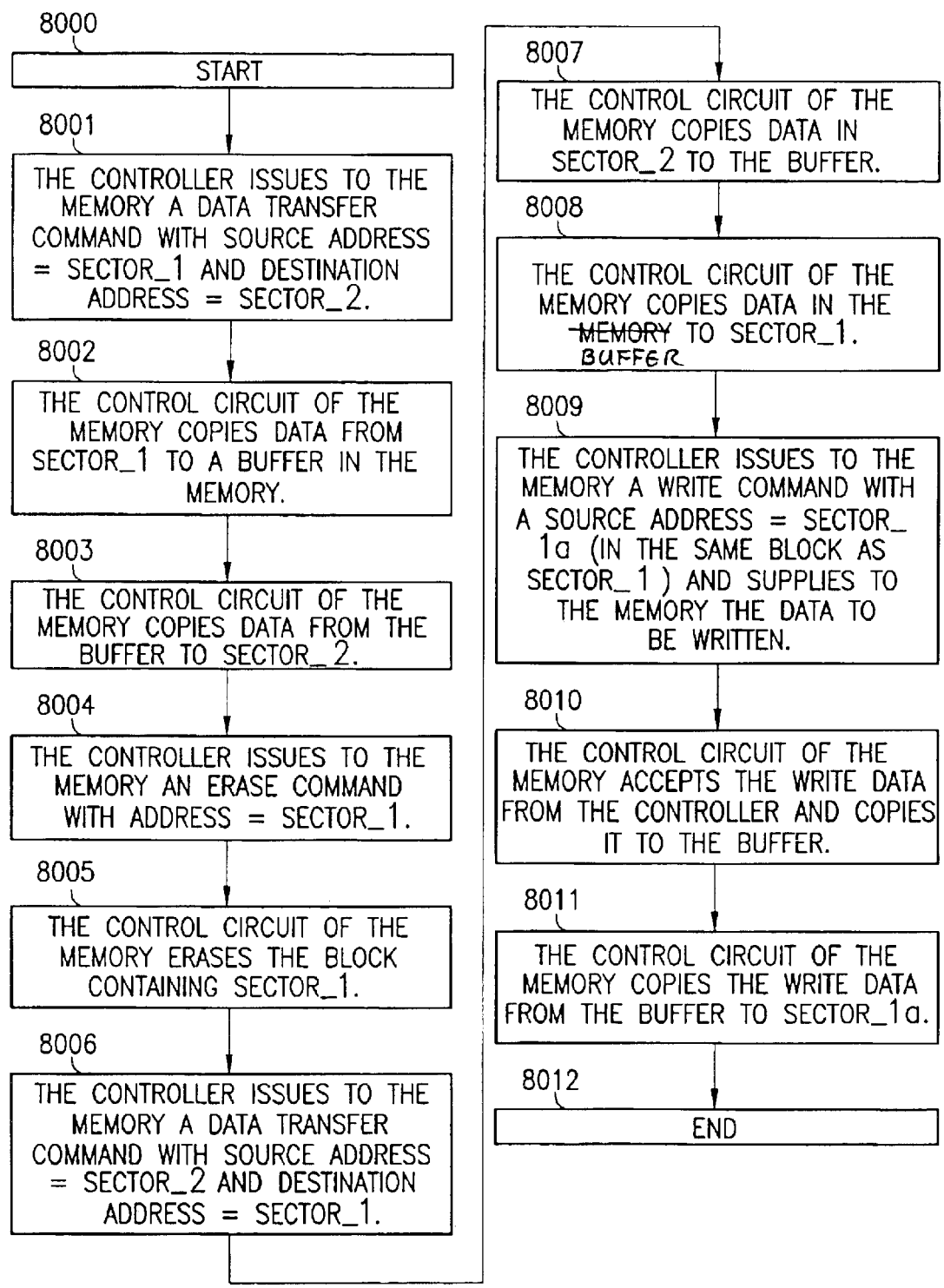
FIGS. 8A and 8B are flow charts summarizing how the data transfer command can be used with the erase command to back up and restore, or copy, the contents of a bock.

In FIG. 8A, the back-up begins at step 8001 with the memory controller 200 issuing a data transfer command using a source address to a sector_1 161a in a first block 161 and a destination address of sector_2 162a in a second block 162. In step 8002, the control circuit, for example, command execution logic 120 and state machine 121, copy data from sector_1 161a to the buffer 150. At step 8003, the control circuit causes the data in the buffer 150 to be copied to sector_2 162a, thereby completing the backup. At step 8004, the controller issues an erase command to the memory, which causes the control circuit at step 8005 to erase the block 161 containing sector_1 161a. At step 8006, the controller 200 begins the restore by issuing a data transfer command having a source address of sector_2 162a and a destination address of sector_1 161a. At steps 8007–8008, the control circuit copies the data from sector_2 162a to the buffer 150, and then from the buffer 150 to the first sector 161a. The backup and restore is completed by step 8008. The use of the internal data transfer command for this purpose is advantageous because it minimizes the amount of external bus traffic and can be used with a simplified external memory controller. At step 8009, the memory controller issues a write command including a source address sector_1a 161b and data to be written. In step 8010, the control circuit stores the write data into the buffer. At step 8011, the contents of the buffer is written to sector_1a 161b, and the procedure ends at step 8012.

In an alternate embodiment, the flash memory device 100 may be used with a controller 200 which supports address remapping. Address remapping is a well known technique in which the flash memory controller 200 is able to associate an address with different blocks 161, 162 of the flash memory device 100. Address remapping may be implemented, for example, via software in the flash memory controller 200 which changes the entries in an internal address look-up table of the controller 200 used to map different address ranges to different blocks 161, 162 of the flash memory 100. When the flash memory 100 is used with a controller 200 which support address remapping, it may not be necessary to restore data to an erased block. For example, suppose a plurality of sectors (e.g., sectors 161a, 161b in block N 161) have been written. Now, new data is to be written to sector 161a. The controller 200 can write the new data to a sector in a different block M 162, then copy the unchanged data from block N 161 (here, sector 161b) to corresponding sector(s) of the different block M 162 (here, block 162b). Then, by, for example, changing the contents of its internal address look-up table, the controller remaps the address range previously associated with block N 161 to block M 162.

Figure 8B:
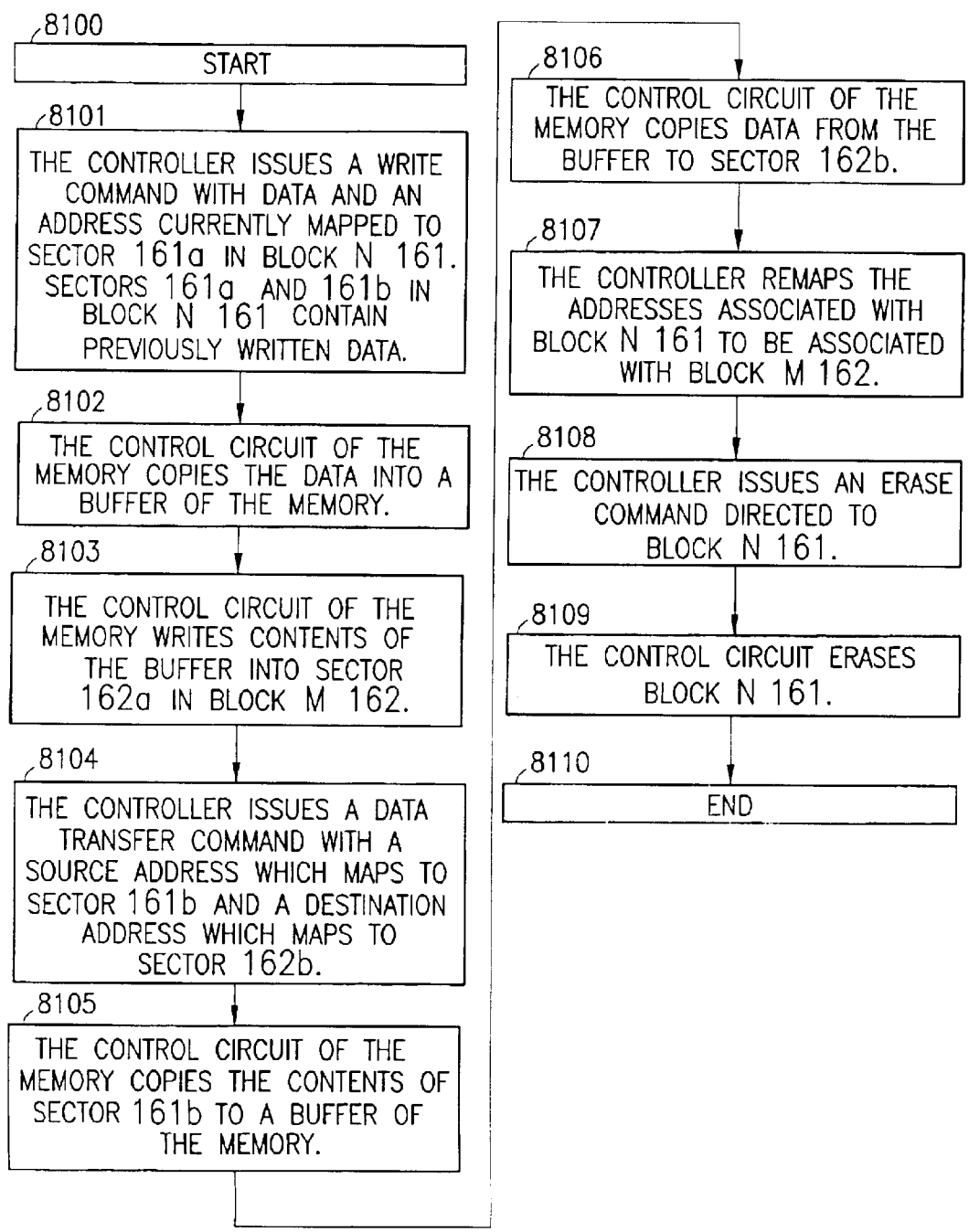

As shown in FIG. 8B in steps 8100–8110, the internal data transfer command of the present invention may also be advantageously used in this environment. At step 8101, the controller 200 issues a write command with an address which, according to the controller's internal address look-up table, is currently mapped to block 161, and more specifically, sector 161a. In block 161, sectors 161a, 161b contain data. In step 8102, the control circuit, for example, command execution logic 120 and state machine 121, copy the data to be written from the bus to the buffer 150. In step 8103, the control circuit causes the data in buffer 150 to be copied to sector 162a. In step 8104, the controller 200 issues a data transfer command having a source address which is mapped to sector 161b and a destination address which is mapped to sector 162b. In step 8105, the control circuit copies the contents of sector 161b to the buffer 150. In step 8106, the control circuit copies the contents of the buffer 150 to sector 162b. In step 8107, the controller 200 changes the address mapping so that addresses currently mapped to block N 161 to be remapped to block M 162. This may be done, for example, by software within the controller 200 which swap the entries associated with blocks N and M in the internal address look-up table. At a subsequent time, the controller 200 issues an erase command to block N.

If multiple sectors must be backed up or transferred before the erase, the controller 200 may issue a plurality of data transfer commands, one per sector, prior to the erase, and use a corresponding plurality of data transfer to restore the data after the erase. Alternatively, if the plurality of sector which require backup are adjacent, and if the memory device 100 implements the multiple data transfer command of the second embodiment, the controller 200 may issue one or more multiple data transfer commands instead of a larger plurality of data transfer commands.

The flash memory device 100 of the present invention may be used in a variety of applications. For example, FIG. 7 is a block diagram of a computer system 1000 which includes a CPU 1001, the memory controller 200, and the flash memory device 100, each coupled through one or more buses 300. The computer system 1000 may optionally include one or more additional devices 1002 commonly found in computer systems, such as storage controllers, graphics adapters, additional bus controllers/buses, etc. In addition to computer system 1000, the flash memory device 100 can also be used in any system requiring non-volatile storage.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A memory device comprising:
    a memory array comprising at least a first storage area and a second storage area, said first storage area including at least a first block and said second storage area including at least a second block, each of said first and second blocks including a plurality of sectors;
    a buffer;
    a control circuit coupled to the memory array and the buffer for accepting external commands and for reading, writing, and erasing portions of said memory array; said
    wherein said control circuit is responsive to a data transfer command, said data transfer command including a source address of a first sector in said first block, a destination address of a second sector in said second block, and a parameter specifying an amount of data, to copy the amount or data specified from sectors in said first block starting with said first sector and to sectors in said second block starting with said second sector, without transferring any content on an external bus.

2. The memory device of claim 1, wherein said memory is a non-volatile memory.

3. The memory device of claim 2, wherein said memory is a flash memory.

4. The memory device of claim 1, wherein each sector of said second block has a size which is at least as large as each corresponding sector of said first block.

5. The memory device of claim 4, said second block has at least as many sectors as said first block.

6. The memory device of claim 5, wherein said first and second blocks have identical number of sectors.

7. The memory device of claim 6, wherein each sector is a same size.

8. The memory device of claim 1, wherein said control circuit causes at least one sector to be first copied from said first block to the buffer and subsequently copied from the buffer to said second block.

9. The memory device of claim 1, wherein said control circuit, responsive to an erase command issued after the data transfer command, erases each sector of said first block; and
    responsive to a second data transfer command issued after the erase command, copies at least one sector from said second block to said first block.

10. The memory device of claim 1, wherein said control circuit further comprises:
    a logic circuit a decoding commands; and
    a state machine for executing decoded commands.

11. A memory device, comprising:
    a memory array comprising at least a first storage area and a second storage area, said first storage area including at least a first block and said second storage area including at least a second block, each of said first and second blocks including a plurality of sectors;
    a buffer;
    a control circuit coupled to the memory array and the buffer for accepting external commands and for reading, writing, and erasing portions of said memory array;
    wherein said control circuit is responsive to a data transfer command, said data transfer command including a source address of a first sector in said first block, a destination address of a second sector in said second block, and a count parameter specifying a number of additional sectors, to copy contents of sectors in said first block starting with said first sector and continuing for said additional sectors in said second block starting with said second sector, without transferring any content on an external bus.

12. A memory system comprising:
    an external bus;
    a controller coupled to said external bus;
    a memory, coupled to said controller via said external bus, wherein said memory further comprises:
        a memory array comprising at least a first storage area and a second storage area, said first storage area including at least a first block and said second storage area including at least a second each of said first and second blocks including a plurality of sector;
        a buffer;
        a control circuit coupled to the memory array and the buffer for accepting external commands and for reading, writing, and erasing portions of said memory array;
    wherein said control is responsive to a data transfer command, said data transfer command including a source address of a first sector in said first block, a destination address of a second sector in said second block, and a length parameter specifying a total number of sectors starting from the source address to be copied to the destination address, to copy contents of sectors in said first block starting with said first sector and continuing for a number of sector so that a total number of sectors, transferred is equal to said length parameter, to sectors in said second block starting with said second sector, without transferring any content to said external bus.

13. The memory system of claim 12, wherein said memory is a non-volatile memory.

14. The memory system of claim 13, wherein said memory is a flash memory.

15. The memory system of claim 12, wherein each sector of said second block has a size which is at least each corresponding sector of said first block.

16. The memory system of claim 15, wherein said second block has at least as many sectors as said first block.

17. The memory system of claim 16, wherein said first and second blocks have identical number of sectors.

18. The memory system of claim 17, wherein each sector is a same size.

19. The memory system of claim 18, wherein said control circuit causes at least one sector to be first copied from said first block the buffer and subsequently copied from the buffer to said second block.

20. The memory system of claim 12, wherein said control circuit,
    responsive to an erase command issued after the data transfer command, erases each sector of said first block; and responsive to a second data transfer command issued after the erase command, copies at least one sector from said second block to said first block.

21. The memory system of claim 12, wherein said control circuit further comprises:
   a logic circuit for decoding commands; and
   a state machine for executing decoded commands.

22. A memory system comprising:
   an external bus;
   a controller coupled to said external bus;
   a memory, coupled to said controller via said external bus, wherein said memory further comprises:
      a memory array comprising at least a first storage area and a second storage area, said first storage area including at least a first block and said second storage area including at least a second block, each of said first and second blocks including a plurality of sectors;
      a buffer;
      a control circuit coupled to the memory array and the buffer for accepting external commands and for reading, writing, and erasing positions of said memory array;
   wherein said control circuit is responsive to a data transfer command, said data transfer command including a source address of a first sector in said first block, a destination address of a second sector in said second block, and a count parameter specifying a number of additional sectors, to copy content of sectors in said first block starting with said first sector and continuing for said additional sectors to sectors in said second block starting with said second sector, without transferring any content on said external bus.

23. A memory of transferring data in a memory device comprising at least a first block and a second block, each of said first and second block comprising a plurality of sector, the method comprising:
   (a) receiving a data transfer command, said data transfer command specifying a first sector in said first block, a second sector in said second block, and a parameter specifying an amount of data to be copied from said block to said second block;
   (b) copying data starting from the first sector to a buffer of said memory device;
   (c) starting with said second sector, copying data from the buffer to the second block of said memory device; and
   (d) performing steps (b) and (c) repeatedly until the amount of data specified by the parameter has been copied from said first block to said second block.

24. The method of claim 23, wherein said device is non-volatile.

25. The method of claim 24, wherein said memory device is a flash memory.

26. The method of claim 23, wherein each sector of said second block has a size which is at least as large as each corresponding sector of said first block.

27. The method of claim 23, wherein said second block has at least as many sector as said first block.

28. The method of claim 23, wherein said first and second blocks have identical number of sectors.

29. The method of claim 28, wherein each sector is a same size.

30. The method of claim 23, wherein said parameter is a count value specifying a total number of sectors to transfer from said first block to said second block.

31. The method of claim 23, wherein said parameter is a length value specifying a number of additional sector to transfer after said first sector has been transferred to said second block.

32. The method of claim 23, further comprising:
   (e) erasing said first block;
   (f) copying data from the second sector to said buffer; and
   (g) copying data from said buffer to said first sector.

33. A processor system comprising:
   a processor;
   a memory controller coupled to said processor;
   a memory coupled to said controller, wherein said memory further comprises:
      a memory array comprising at least a first storage area and a second storage area, said first storage area including at least a first block and said second storage area including a at least a second block, each of said first and second blocks including a plurality of sectors;
      a buffer;
      a control circuit coupled to the memory array and the buffer for accepting external commands and for reading, writing, and erasing portions of said memory array,
   wherein said control circuit is responsive to a data transfer command, said data transfer command including a source address of a first sector in said first block, a destination address of a second sectors in said second block, and a length parameter specifying a total number of sectors starting from the source address to be copied to the destination address, to copy contents of sectors in said first block starting with said first sector and continuing for a number of sectors so that a total number of sectors transferred is equal to said length parameter, to sectors in said second block starting with said second sector, without transferring any content to an external bus.

34. The processor system of claim 33, wherein said memory is a non-volatile memory.

35. The processor system of claim 34, wherein said memory is a flash memory.

36. The processor system of claim 33, wherein each sector of said second block has a size which is at least as large as each corresponding sector of said first block.

37. The processor system of claim 36, wherein said second block has at least as many sectors as said first block.

38. The processor system of claim 37, wherein said first and second blocks have identical number of sectors.

39. The processor system of claim 38, wherein each sector is a same size.

40. The processor system of claim 33, wherein said control circuit causes at least one sector to be first copied from said first block to the buffer and subsequently copied from the buffer to said second block.

41. The processor system of claim 33, wherein said control circuit,
   responsive to an erase command issued after the data transfer command, erases each sector of said first block; and
   responsive to a second data transfer command issued after the erase command copies at least one sector from said second block to said first block.

42. The processor system of claim 33, wherein said control circuit further comprises:
- a logic circuit for decoding commands; and
- a state machine for executing decoded commands.

43. A processor system comprising:
- a processor;
- a memory controller coupled to said processor;
- a memory coupled to said controller, wherein said memory further comprises:
  - a memory array comprising at least a first storage area and a second storage area, said first storage area including at least a first block and said second storage area including at least a second block, each of said first and second blocks including a plurality of sectors;
  - a buffer;
  - a control circuit coupled to the memory array and a the buffer for accepting external commands and for reading, writing, and erasing portions of said memory array;
- wherein said control circuit is responsive to a data transfer command, said data transfer command including a source address of a first sector in said first block, a destination address of a second sector in said second block, and a count parameter specifying a number of additional sectors, to copy contents of sectors in said first block starting with said first sector and continuing for said additional sectors to sectors in said second block starting with said second sector, without transferring any content on an external bus.

* * * * *